US 6,575,776 B1

(12) United States Patent
Conner et al.

(10) Patent No.: US 6,575,776 B1
(45) Date of Patent: Jun. 10, 2003

(54) CONVECTIVE COOLING VENTS FOR ELECTRICAL CONNECTOR HOUSING

(75) Inventors: Troy Everette Conner, York, PA (US); Daniel Robert Ringler, Elizabethville, PA (US); Melissa Ann Sherman, Mechanicsburg, PA (US); Michael Allen Blanchfield, Camp Hill, PA (US)

(73) Assignee: Tyco Electronics Corporation, Middletown, PA (US)

( * ) Notice: Subject to any disclaimer, the term of this patent is extended or adjusted under 35 U.S.C. 154(b) by 0 days.

(21) Appl. No.: 10/051,553

(22) Filed: Jan. 18, 2002

(51) Int. Cl.⁷ .............................. H01R 40/60
(52) U.S. Cl. .................................. 439/206
(58) Field of Search ..................... 439/206, 190, 439/205

(56) References Cited

U.S. PATENT DOCUMENTS

| | | | |
|---|---|---|---|
| 1,909,140 A | 5/1933 | Wermine | |
| 2,038,816 A | 4/1936 | Wetzel | 173/332 |
| 2,042,398 A | 5/1936 | Hile | 173/332 |
| 2,095,439 A | 10/1937 | Higgins | 200/51 |
| 3,601,775 A | * 8/1971 | Longenecker et al. | 439/636 |
| 5,268,815 A | 12/1993 | Cipolla et al. | 361/704 |
| 5,639,250 A | 6/1997 | Neef et al. | 439/79 |
| 5,752,840 A | 5/1998 | Wu et al. | 439/76.1 |
| 6,206,730 B1 | * 3/2001 | Avery et al. | 439/609 |

* cited by examiner

*Primary Examiner*—Tho D. Ta
*Assistant Examiner*—Ross Gushi

(57) ABSTRACT

An electrical connector having improved cooling is provided. The electrical connector has a housing having at least one mating surface defined on a first plane and a surface defined on a second plane, where the first and second plane are perpendicular to each other. At least one passageway is defined by the mating surface and adapted to receive at least one contact. At least one vent is defined by the surface and adapted to create turbulent airflow in an interior chamber.

43 Claims, 10 Drawing Sheets

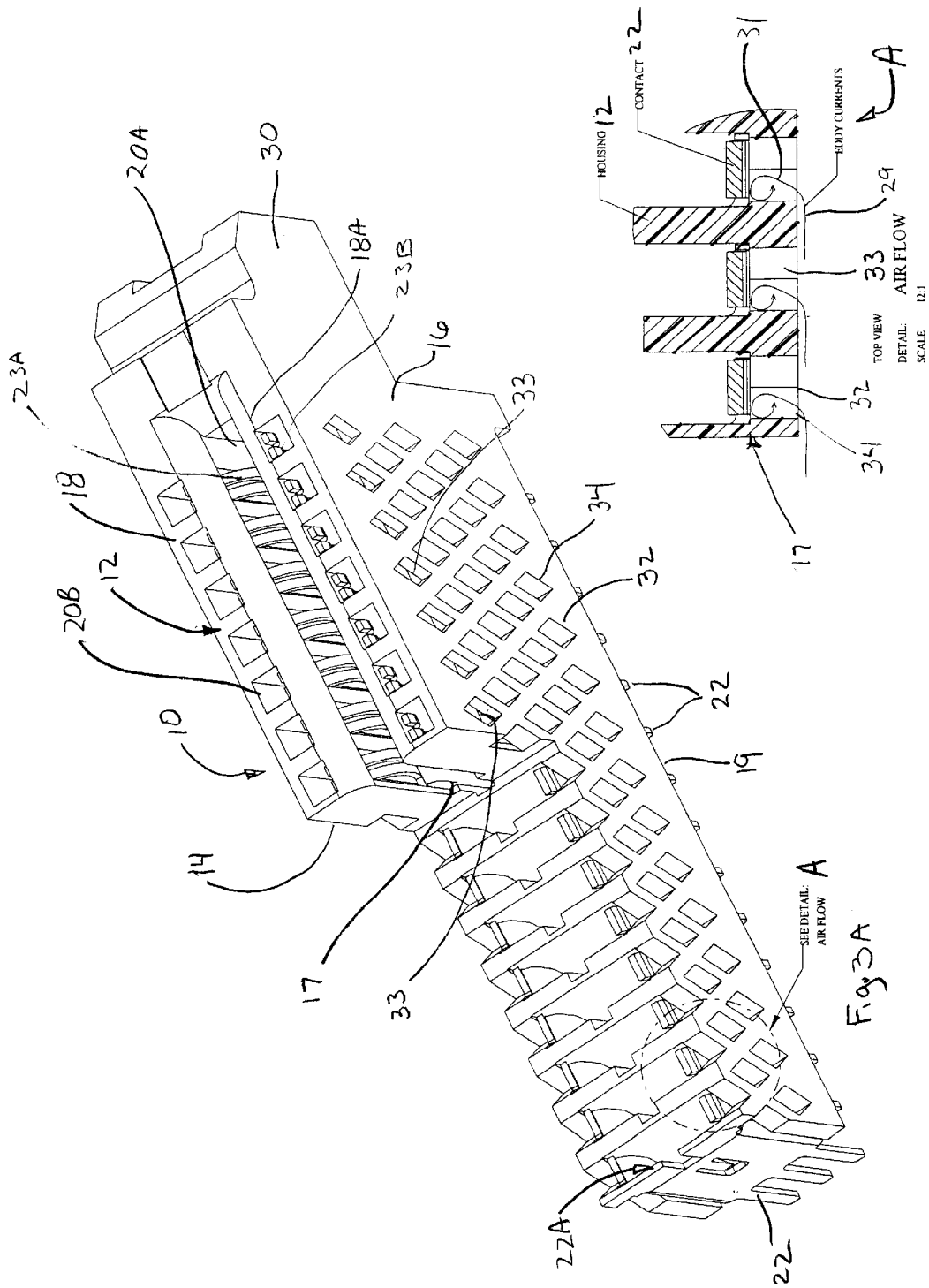

Fig. B

CONVECTIVE COOLING VENTS FOR ELECTRICAL CONNECTOR HOUSING

RELATED APPLICATIONS

[Not Applicable]

FEDERALLY SPONSORED RESEARCH OR DEVELOPMENT

[Not Applicable]

[MICROFICHE/COPYRIGHT REFERENCE]

[Not Applicable]

BACKGROUND OF THE INVENTION

Certain embodiments of the invention relate to convective cooling vents and more particularly to convective cooling vents used with electrical connectors.

Plug-in circuit boards with electronic components thereon are widely used in the telecommunication and computer industries, among other industries. Generally, power and data signals are conveyed to and from the circuit boards at a desired data rate using cables and connectors.

Depending on the application, such circuit boards, cables and connectors generate a lot of heat which may affect system performance and ultimately may affect signal integrity. As transmission speeds increase, increasing system performance and preserving signal integrity becomes more critical. To address such concerns, components that facilitate heat dissipation are preferred over those that don't dissipate heat or have minimal heat dissipation.

A need exists for an electrical connector with improved heat dissipation. There is a further need for dissipating heat in electrical connectors using convective cooling vents in the connector. These cooling vents, are adapted to ventilate the connector in still air or to provide improved ventilation in moving air, adding to the overall total performance of the electrical connector since, by facilitating heat dissipation, the cooling vents enable any given connector to carry more current.

It is an object of at least one embodiment of the present invention to meet the foregoing needs and other objectives, which will become apparent from the detailed description, drawings and claims presented hereafter.

BRIEF SUMMARY OF THE INVENTION

In accordance with one embodiment of the present invention, an electrical connector or connector assembly has been developed that convectively cools an interior chamber of the connector. The housing includes at least one surface defining at least one vent adapted to create a turbulent airflow in the interior chamber. The vent fluidly communicates with the interior chamber using a channel defined in the housing. In one embodiment, these cooling vents are designed to ventilate a connector in still air or to provide improved ventilation in moving air. Improving ventilation improves the performance of the connector, as facilitating heat dissipation enables a given connector to carry more current.

In accordance with another embodiment of the present invention, the electrical connector has a housing having at least one mating surface defined on a first plane and a surface defined on a second plane, where the first and second plane are perpendicular to each other, is provided. At least one passageway is defined by the mating surface and adapted to receive at least one contact. At least one vent is defined by the surface and adapted to create turbulent airflow in an interior chamber.

In accordance with at least one alternative embodiment of the present invention, the vents are generally polygonal (i.e., multi-sided) in shape, having at least one edge adapted to create an eddy current along a surface. The vent shape may include, but is not limited to, diamonds, rectangles, squares, octagons, although circles and ovals are also contemplated. Further, the vents may be angled inwardly or outwardly from a side surface of the housing.

In accordance with at least one alternative embodiment of the present invention, the connector housing has opposing sides defining the interior chamber, wherein each of the sides defines a plurality of vents. The number of vents may be equal on both sides or different. The vents may be defined on both sides or only on one side. The vents may be arranged in rows, columns, or arranged randomly. All of the vents may be similar or different shapes. All of the vents may be the same or different sizes.

In yet another embodiment, the connector includes a plurality of electrical contacts. Another embodiment may include a plurality of passageways adapted to receive a plurality of contacts with a circuit board disposed in the interior portion.

In accordance with yet another embodiment, the present invention includes a circuit board for use with data transfer and power distribution. The circuit board includes a circuit trace and a connector adapted to engage the circuit trace. The connector includes a housing having opposing sides defining an interior chamber, where at least one of the sides defines a plurality of vents arranged in vent rows and vent columns where the vents are adapted to create a turbulent air flow in the interior chamber.

Another embodiment of the present invention includes a method of convectively cooling an electrical connector. The method includes creating an eddy current along a surface of the connector, then creating a turbulent air flow in an interior chamber of the connector using the eddy current. In yet another embodiment, the method creates the eddy current along one edge of a vent defined in the surface of the connector.

Further limitations and disadvantages of conventional and traditional approaches will become apparent to one of skill in the art, through comparison of such systems with the present invention as set forth in the remainder of the present application with reference to the drawings.

BRIEF DESCRIPTION OF SEVERAL VIEWS OF THE DRAWINGS

The foregoing summary, as well as the following detailed description of the embodiments of the invention, will be better understood when read in conjunction with the appended drawings. For the purpose of illustrating the invention, there is shown in the drawings, embodiments which are preferred. It should be understood, however, that the present invention is not limited to the precise arrangements and instrumentality shown in the attached drawings.

FIG. 3A illustrates a perspective view of the connector of FIGS. 1 and 2 having a port portion removed in accordance with one embodiment of the present invention;

FIG. 3B illustrates an enlarged top view of detail A of the connector illustrated in FIG. 3A in accordance with one embodiment of the present invention;

DETAILED DESCRIPTION OF THE INVENTION

Figure 1:
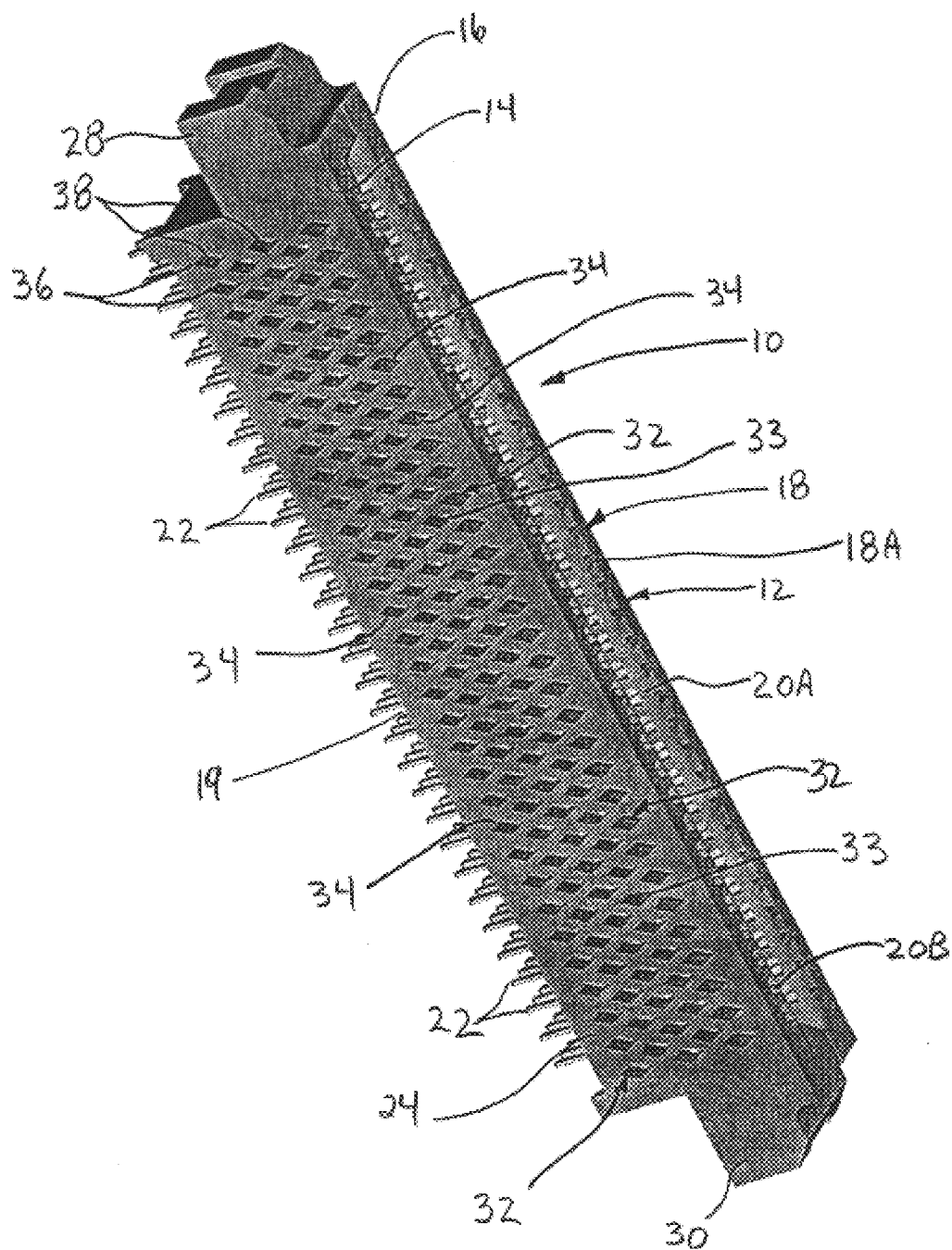
FIG. 1 illustrates a perspective view of a connector having generally diamond shaped convective vents in accordance with one embodiment of the present invention.
Figure 2:
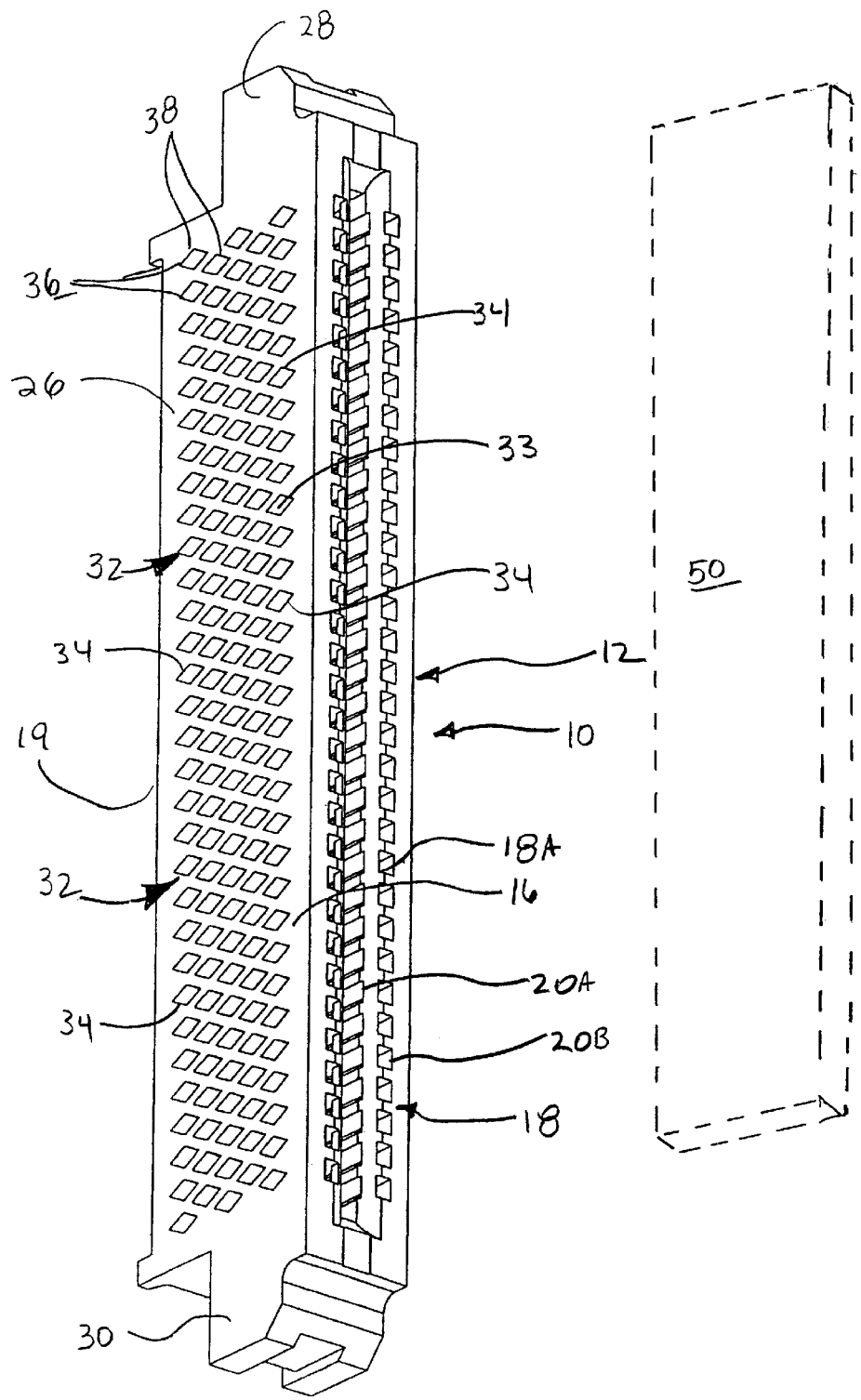
FIG. 2 illustrates a perspective view of a second side of the connector of FIG. 1 in accordance with one embodiment of the present invention.

One embodiment of an electrical connector or connector assembly, generally designated 10, is illustrated in FIGS. 1 and 2. The illustrated connector 10 comprises an insulated housing 12 having opposing first and second portions or sides 14 and 16 (best seen in FIG. 2), respectively. In one embodiment, the housing 12 is made of any suitable insulating or non-conductive material, including liquid crystal polymer ("LCP") for example.

In one embodiment, the housing has opposing engagement portions defined on a first plane, each engagement portion having a mating surface. At least one of the engagement portions defines one or more passageways. The housing further has opposing sides defined on a second plane. At least one of the sides defines one or more vents used to convectively cool the connector 10. In one embodiment, the first and second planes are perpendicular to each other, although other embodiments are contemplated. For example, the first and second planes may form a 45 or 60 degree angles depending on the environment.

Housing 12 is illustrated having a first engagement portion 18 defined on a first plane and having one or more passageways 20A and 20B defined therein, adapted to receive and align a plurality of contacts therein. First engagement portion 18 has a mating surface 18A adapted to engage another connector, PC card, etc.

The two sides 14 and 16 define a cavity or interior chamber 17 (best seen in FIGS. 3A, 3B and 3C) in fluid communication with passageways 20. While passageways 20 are illustrated, any I/O connector port is contemplated. Further, in one embodiment, the interior chamber 17 is adapted to receive a PC or other circuit board 50 having an electric trace therein (illustrated in phantom in FIG. 2), passive or active electrical components, electrical contacts or connectors, spacers, etc.

A plurality of pins or contacts 22, illustrated in FIG. 1 (not shown in FIG. 2) connect to and extend from a second engagement portion 19 opposite first engagement portion. It should be appreciated that, while a plurality of pins are illustrated, one or more pins are contemplated. It should also be appreciated that one end of the pins 22 may electrically connect to and communicate with PC or other circuit board, passive or active electrical components, electrical contacts or connectors, etc. contained in the interior 17. Opposite ends 22A of the pins 22 extend into the interior chamber 17 and are adapted to electrically engage the contacts received in the passageway 20.

Sides 14 and 16 each have first or outer faces 24 and 26, respectively, as illustrated in FIGS. 1 and 2. Additionally, each side 14 and 16 has opposing second or inner faces (not shown) that define the inner chamber. Two opposing connecting ends 28 and 30 are shown adapted to engage another connecter, cable, PC board, etc. In one embodiment, retention connector 10 includes retention clips (not shown) connected to connecting ends 28 and 30 and adapted to removable engage circuit board 50.

In one embodiment of the present invention, outer surface 24 includes one or more vents 32 as illustrated in FIG. 1 which are adapted to promote effective and efficient convective cooling in the connecter, in comparison to conventional connectors. At least one, but generally all of the vents 32 are in fluid communication with the interior chamber. In one embodiment, fluid communication is accomplished using channel 33 defined by the sides and extending between the surface and the interior chamber.

In one embodiment, the vents 32 are polygonal or multi-sided and include without limitation, triangles, squares, diamonds, rectangles, octagons, etc. It is also contemplated that round or oval shaped vents 32 may be utilized depending on the connector cooling requirements and airflow. The surface 14 defines leading edge 34 for each of the vents adapted to create an of air flow along the surface thereof. In the illustrated embodiment, four sharp edges 34 are defined for each of the vents 32 although other embodiments are contemplated.

It should be appreciated that other arrangements are contemplated depending on the connector and the cooling requirements. For example, the vents could differ in shape (i.e. some of the vents are diamond shaped while other vents are rectangular, square, round, ovals, etc.); differ in size (i.e., some of the vents could be larger than other respective ones); differ in arrangement (i.e., some of the vents could having leading edges on all sides, while other respective ones have leading edges on only one or two sides); etc. Additionally, the vents could be angled to better direct airflow into and out of the connector housing. For example, the vents may be angled towards or away from one side of the housing to better direct airflow into and out of the housing. In one embodiment, the opposing vents are angled towards opposing sides of the housing (best viewed in FIG. 3C).

In the embodiment illustrated in FIG. 1, each of the plurality of diamond shaped vents 32 has four leading edges 34 and channels 33. It should be appreciated the four leading edges 34 enable the vents 32 to interact with air from four generally perpendicular directions. As air flows over the connector 10, the sharp edges 34 create an eddy current along the surface. This eddy current flows down the channel 33 into the inner chamber of the connector 10. The airflow from the plurality of sources (e.g., channels 33) creates a turbulent airflow in the interior chamber that cools the connector 10. In one embodiment, as air continues to flow down the channels 33, hot air in the interior chamber is exhausted or vented out of one or more of the vents 32.

In the illustrated embodiment of FIG. 1, the vents 32 are aligned or extend along an axis defined by the first and second engagement portions 18 and 19 and are arranged in a grid or array defined as vent columns 36 and vent rows 38. A pair of adjacent vent columns 36 and a pair of adjacent vent rows 38 are indicated by reference numerals in FIG. 1. In the present example, there are a total of five rows and alternating columns of thirty and thirty-one vents. It should be appreciated that the terms columns and rows are arbitrary designations that are assigned to distinguish the linear arrays extending in one direction from the linear arrays extending generally perpendicular thereto, and that these terms are independent of the orientation of the connector. It should also be appreciated that while a particular number of vent rows and columns are depicted and discussed, any number of columns and rows are contemplated.

One embodiment of side 16 of housing 12 is illustrated in FIG. 2. This embodiment includes a plurality of vents 32 arranged in a grid or array of vent columns 36 and vent rows 38 aligned along the axis defined by the first and second engagement portions 18 and 19. In the illustrated embodiment, the vents 32 are again diamond shaped having four leading or defined edges 34 arranged in rows and alternating columns similar to that discussed previously with respect to FIG. 1. This arrangement enhances the turbulence in the interior chamber, enhancing the convective cooling effect. Alternatively, it is contemplated that the vents 32 on one side of the housing 12 enable air to enter the interior chamber while the vents 32 on the opposing side enable heat to be vented or exhausted.

It should be appreciated that alternative embodiments of side 16 are contemplated. In one embodiment, side 16 does not have any vents 32 so that the side 16 is solid or flat. In this embodiment, all the eddy currents are created on the opposing side 14. Alternatively, one or more of the vents 32 on side 14 could differ in shape, in size, in number, in orientation or in arrangement, or some combination of these factors, from the vents 32 on the opposing side 16. For example, the vents 32 on side 14 may be diamond shaped while the vents 32 on the opposing side 16 are rectangles, squares, etc. The vents 32 could be larger on side 14 than the opposing side 16, or one side may only have four rows as compared to five rows on the opposing side. Additionally, the vents 32 may all be the same size and shape in one particular array on side 14 and different sizes, shapes and array on the opposing side 16. Further some of the vents 32 may have leading edges 34 on all sides, while other respective vents 32 have leading edges 34 on only one, two or three sides.

Figure 3C:
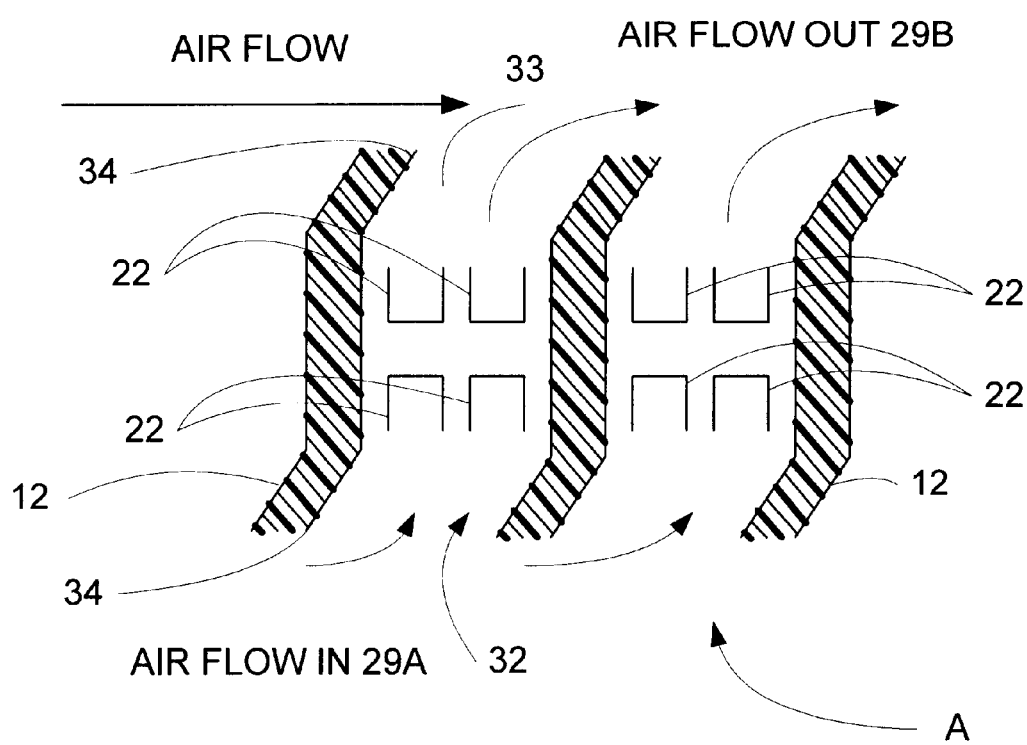
FIG. 3C illustrates an alternative embodiment of the enlarged top view of the detail A of the connector illustrated in FIG. 3A in accordance with one embodiment of the present invention.

A partially cut away perspective view of one embodiment of a connector similar to that depicted in FIGS. 1 and 2 is illustrated in FIG. 3A. FIGS. 3B and 3C illustrate alternate embodiments of the detail A of FIG. 3A. FIG. 3A illustrates the first engagement portion 18 and mating surface 18A defining passageways 20A and 20B in fluid communication with the interior chamber 17. The vents 32 are illustrated in fluid communication with the interior chamber 17 via channels 33. Flexible or resilient members 23A and 23B (alternatively referred to as electronic contact devices) are illustrated in passageways 20A and 20B. In this embodiment these members are used to create a conductive path for electrical current.

It should be appreciated that, while one or more termination style are illustrated and discussed, other termination styles are contemplated. For example, pins and round wire or ribbon cable are illustrated, but other termination techniques such as surface mount soldered to printed circuit board and additional connector housing geometries such as circular connectors and multiple rows (more than the two rows shown) are contemplated.

FIG. 3B illustrates the enlarged top view of detail A of FIG. 31 depicting housing 12 having opposite ends 22A of the contacts 22 extending into the connector in accordance with the present invention. FIG. 3B illustrates at least one eddy current 29 created by leading edge 34 flowing down channel 33 into interior chamber 17 forming a turbulent air flow 31 therein, cooling the connector 10.

FIG. 3C illustrates an alternate embodiment of the enlarged top view of detail A illustrated in FIG. 3B depicting housing 12 having opposite ends 22A of the contacts 22 extending into the connector in accordance with the present invention. In this embodiment, the vents are angled towards at least one side of the housing. For example, here the opposing vents are angled towards opposing sides of the housing. FIG. 3C further illustrates air flow in and air flow out 29A and 29B respectively created by the leading edge 34 flowing down channel 33 cooling the connector 10.

Figure 4:
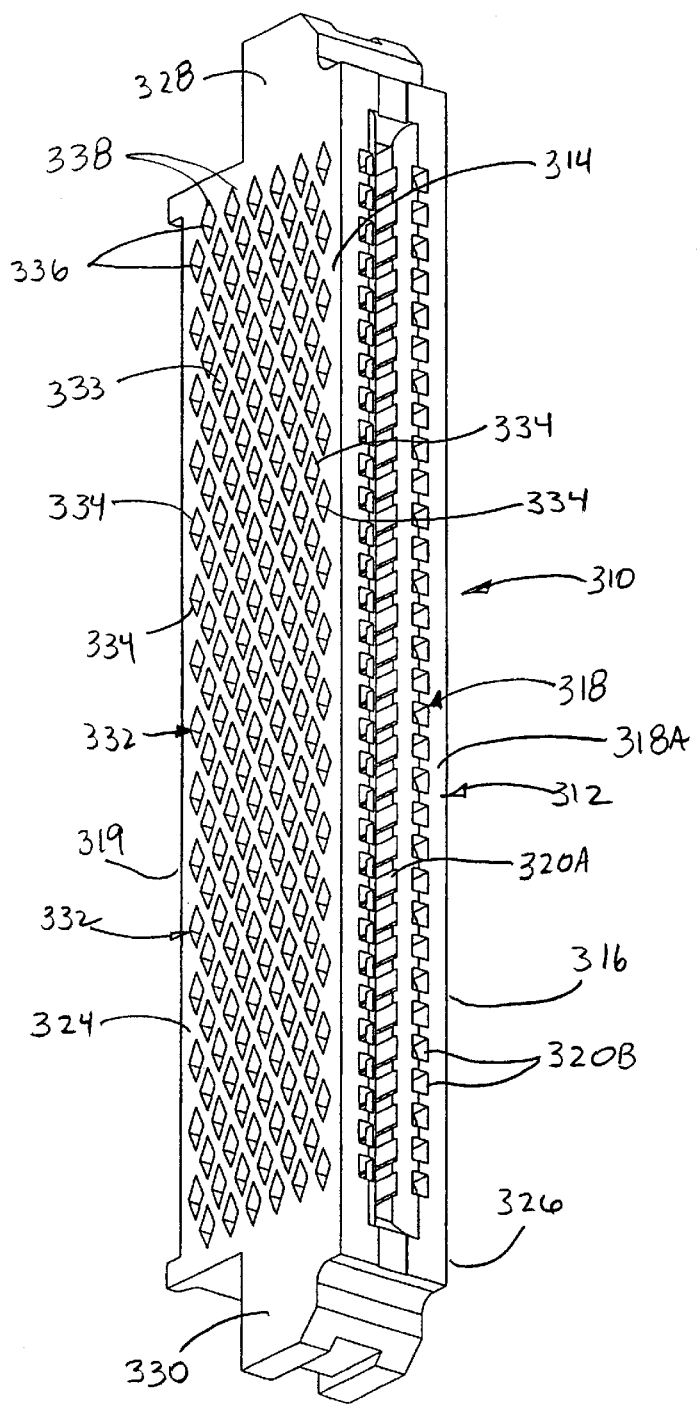
FIG. 4 illustrates a perspective view of a connector similar to that of FIGS. 1 and 2 in accordance with one embodiment of the present invention.

Another embodiment of an electrical connector or connector assembly, generally designated 310, is illustrated in FIG. 4 similar to that discussed previously with respect to FIGS. 1 and 2. The illustrated connector 310 again comprises a housing 312 having opposing first and second sides 314 and 316 respectively.

The subject housing 312 has first and second engagement portions 318 and 319, where first engagement portion 318 with mating surface 318A has one or more passageways 320 (passageway 320A and 320B are illustrated) defined therein, adapted to receive and align a plurality of contacts. The two portions 314 and 316 define a cavity or interior chamber (not shown), which, in one embodiment, is in fluid communication with the passageways 320.

Sides 314 and 316 each have first or outer faces 324 and 326 respectively and opposing second or inner faces (not shown) that define the inner chamber. Again, two opposing connecting ends 328 and 330 are shown adapted to engage another connecter, cable, PC board, etc.

Outer surface 324 defines one or more vents 332 and channels 333 as illustrated in FIG. 4 which are adapted to promote convective cooling in the connecter, dissipating heat therein. At least one, but generally all the vents 332 and channels 333 are in fluid communication with the interior chamber. In this embodiment, the vents 332 are polygonal or multi-sided, more specifically the illustrated vents 332 are again generally diamond shaped, but could also be round or oval. The surface 314 defines at least one sharp or leading edge 334 for each of the vents adapted to create an eddy current along the surface thereof. In the illustrated embodiment, four sharp edges 334 are defined for each of the vents 332 although other embodiments are contemplated.

In this embodiment, the vents 332 are aligned along an axis defined by ends 328 and 330. It should be appreciated the defining four leading edges 334 enables the vents 332 to interact with air flowing from four generally perpendicular directions. The vents 332 are arranged in a grid or array of vent columns 336 and vent rows 338. A pair of adjacent columns 336 and adjacent rows 338 is indicated by reference numerals in FIG. 4. In the present example there are a total of five vent rows and alternating vent columns of 15 and 16 vents.

Figure 5:
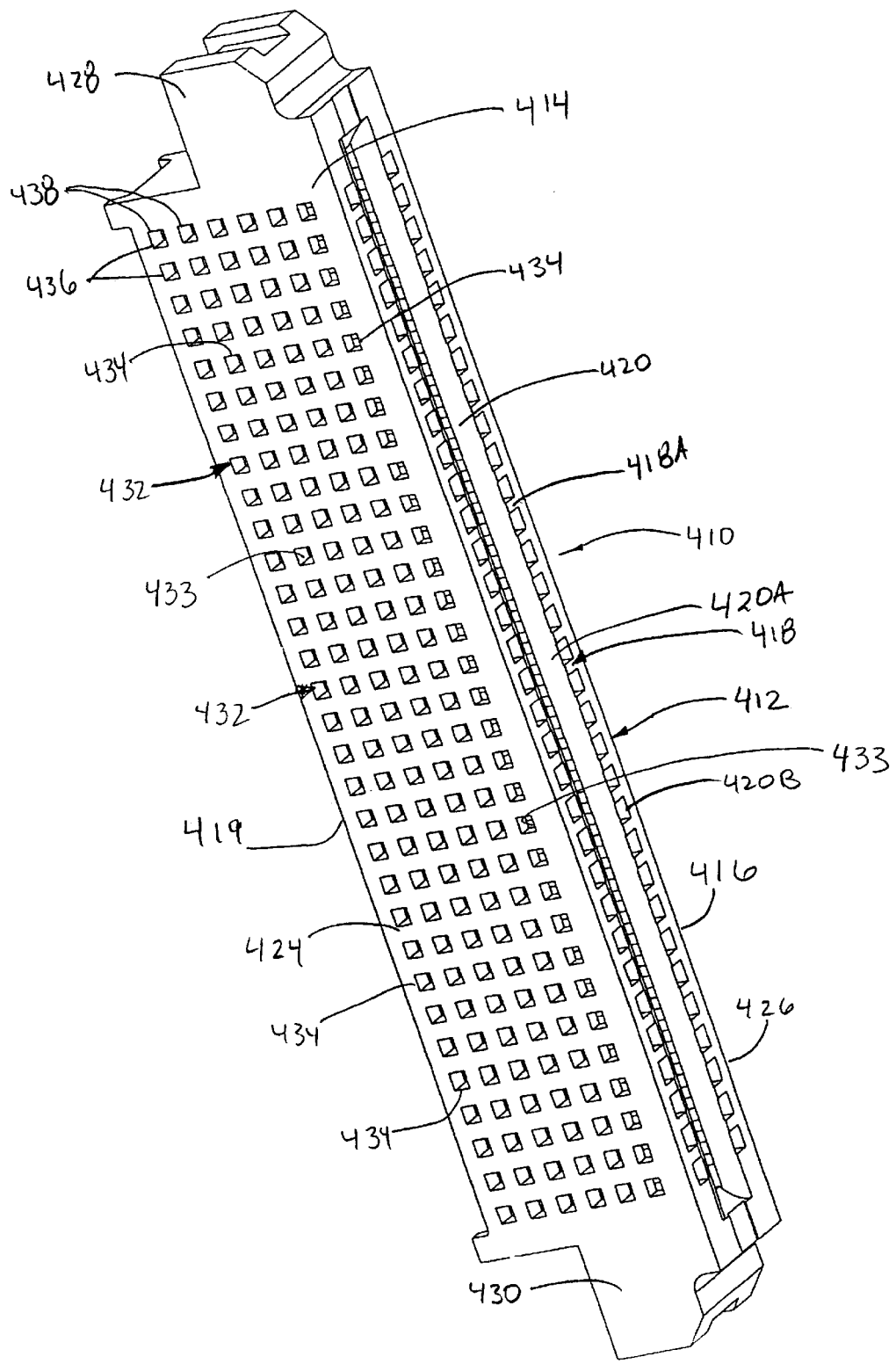
FIG. 5 illustrates a perspective view of a connector having generally square shaped convective vents in accordance with one embodiment of the present invention.

Another embodiment of an electrical connector or connector assembly, generally designated 410, is illustrated in FIG. 5. The illustrated connector 410 comprises an insulated housing 412 having opposing first and second sides 414 and 416 respectively. The housing 412 has first and second engagement portions 418 (having mating surface 418A) and 419, having one or more passageways 420 defined in first engagement portion 418 which is adapted to receive and align a plurality of contacts therein. The two portions 414 and 416 define the interior chamber, which, in one embodiment, is in fluid communication with the passageways 420 (passageways 420A and 420B are illustrated).

Sides 414 and 416 each have first or outer faces 424 and 426, respectively, and opposing second or inner faces (not shown) that define the inner chamber. Two opposing connecting ends 428 and 430 are shown adapted to engage another connector, cable, PC board, etc. In one embodiment of the present invention, outer surface 424 defines one or more vents 432 and channels 433 as illustrated which are adapted to promote convective cooling in the connector, dissipating heat therein. At least one, but generally all the vents 432 and channels 433 are in fluid communication with the interior chamber.

In this embodiment, the vents 432 are generally square. The surface 414 defines at least one sharp or leading edge 434 for each of the vents 432, adapted to create an eddy current along the surface thereof. In the illustrated embodiment, four sharp edges 434 are defined for each of the vents 432 although other embodiments are contemplated. It should be appreciated the defining four leading edges 434 enable the vents 432 to interact with air flowing from four generally perpendicular directions. As air flows over the connector 410, the sharp edges 432 of the squares create an eddy current along the surface. This eddy current flows down the channel 433 into the interior chamber of the connector, creating a turbulent air flow in the interior chamber that cools the connector 410 off.

In the illustrated embodiment of FIG. 5, the vents 432 are arranged in vent columns 436 and vent rows 438. A pair of adjacent columns 436 and a pair of adjacent rows 438 is indicated by reference numerals. In the present example there are a total of six vent rows 438 and thirty-one vent columns 436.

Figure 6:
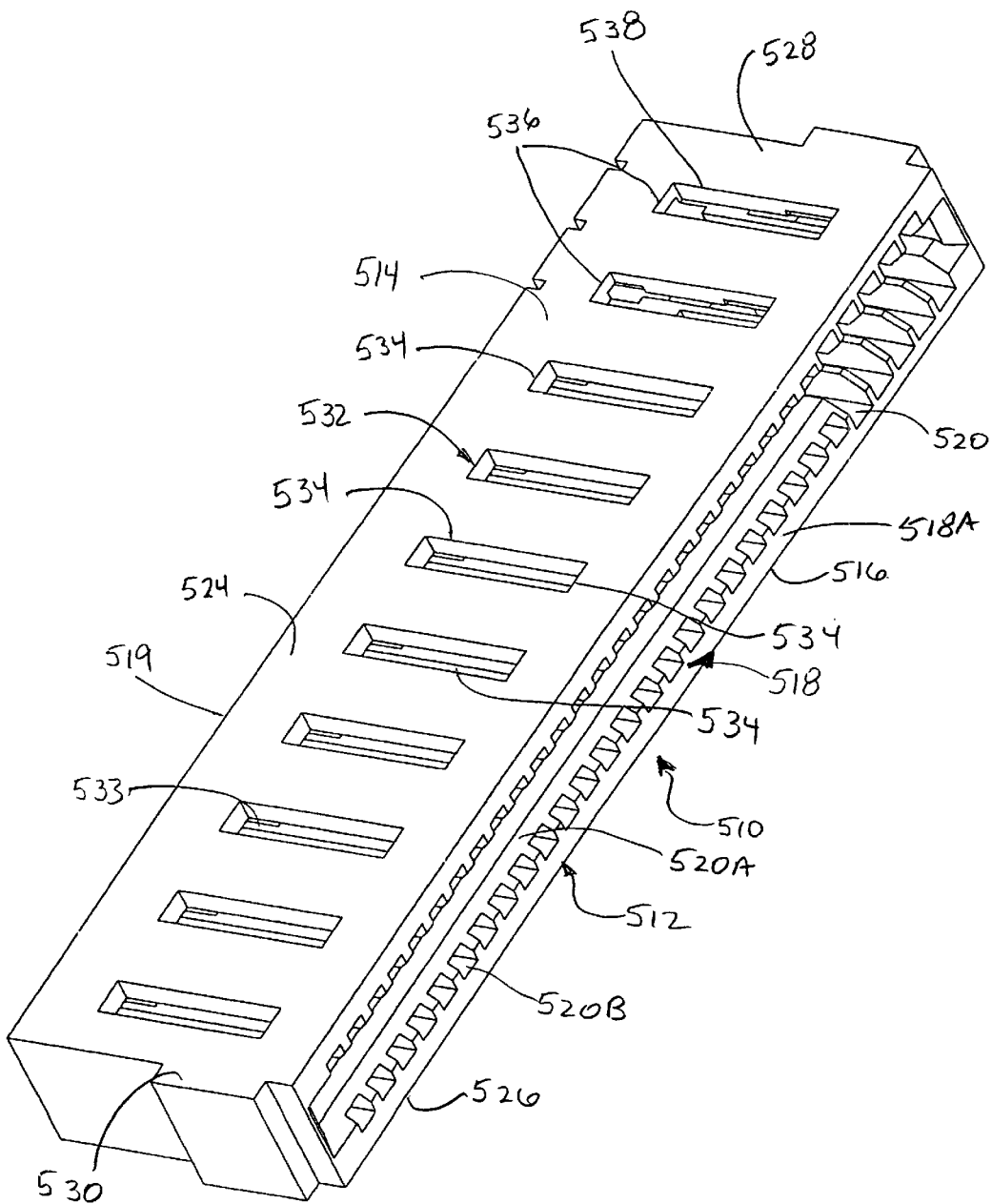
FIG. 6 illustrates a perspective view of a connector having generally rectangular shaped convective vents in accordance with one embodiment of the present invention.

Yet another embodiment of an electrical connector or connector assembly, generally designated 510, is illustrated in FIG. 6. The illustrated connector 510 comprises a housing 512 having opposing first and second sides 514 and 516. The subject housing has first and second engagement portions 518 (having mating surface 518A) and 519, having one or more passageways 520 defined in first engagement portion 518 and adapted to receive and align a plurality of contacts therein. The two sides 514 and 516 define the interior chamber, which, in one embodiment, is in fluid communication with the passageways 520 (passageways 520A and 520B are illustrated).

Sides 514 and 516 each have first or outer faces 524 and 526 respectively as illustrated. Additionally, each side has opposing second or inner faces (not shown) that define the inner chamber. Two opposing connecting ends 528 and 530 are shown and adapted to engage another connector, cable, PC board, etc.

In one embodiment of the present invention, outer surface 524 defines one or more vents 532 and channels 533 as illustrated. At least one, but generally all the vents 532 and channels 533 are in fluid communication with the interior chamber. In this embodiment, the vents 532 are rectangular. The surface 514 defines at least one sharp or leading edge 534 for each of the vents adapted to create an eddy current along the surface thereof. In the illustrated embodiment, four sharp edges 534 are defined for each of the vents although other embodiments are contemplated.

It should be appreciated that other arrangements are contemplated depending on the connector 510 and the cooling requirements. For example, the vents could differ in shape, (i.e. some of the vents 532 are rectangular while other vents are square, etc.); in size (some of the vents could be larger than other respective ones); arrangement (i.e., some of the vents could having leading edges on all sides, while other respective ones have leading edges on only one or two sides); etc.

In the embodiment illustrated in FIG. 6, each of the plurality of rectangular shaped vents 532 has four leading edges aligned along an axis defined by the first and second engagement portions 518 and 519. It should be appreciated the defining four leading edges enables the vents to interact with air flowing from four generally perpendicular directions, generally moving from end to end. As air flows over the connector, the sharp edges of the rectangular vents 532 create an eddy current along the surface. This eddy current flows down the channel 533 into the internal chamber of the connector In the illustrated embodiment of FIG. 6, the vents 532 are arranged in vent columns 536 and vent rows 538. A pair of adjacent columns 536 and one row 538 is indicated. One vent row 538 and 10 vent columns 536 are illustrated.

Figure 7:
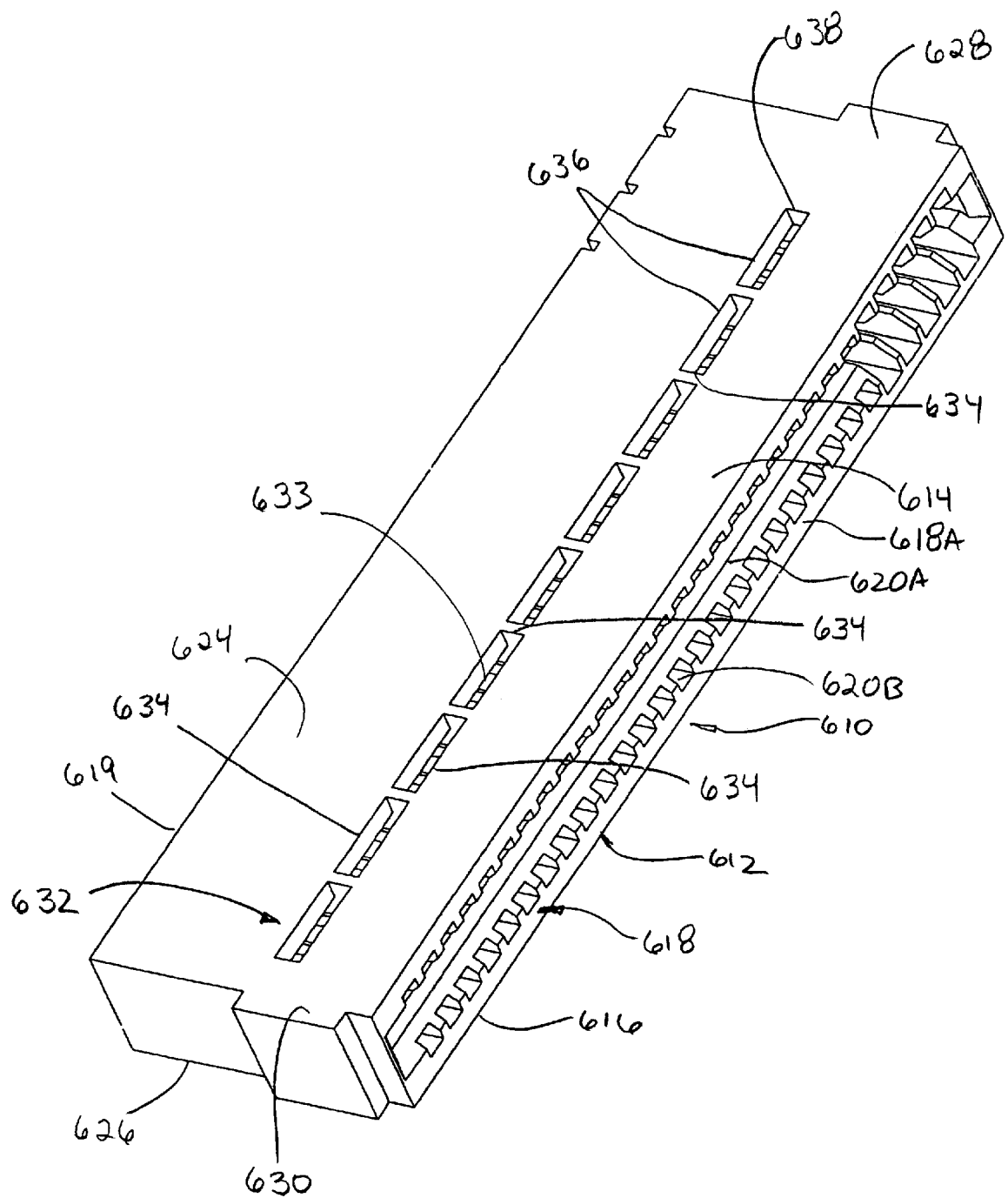
FIG. 7 illustrates a perspective view of a connector having generally rectangular shaped convective vents similar to those of FIG. 6 in accordance with one embodiment of the present invention.

Yet another embodiment of an electrical connector or connector assembly, generally designated 610, is illustrated in FIG. 7. The illustrated connectors 610 comprises a housing 612 having opposing first and second sides 614 and 616 and first and second engagement portions 618 (having mating surface 618A) and 619, having one or more passageways 620 defined in first engagement 618 adapted to receive and align a plurality of contacts therein. The two sides 614 and 616 define a cavity or interior chamber (not shown) in fluid communication with the passageways 620 (passageways 620A and 620B are illustrated).

Sides 614 and 616 each have first or outer faces 624 and 626 respectively as illustrated. Additionally, each side has opposing second or inner faces (not shown) that define the inner chamber. Two opposing connecting ends 628 and 630 are illustrated.

In one embodiment of the present invention, outer surface 624 defines one or more vents 632 and channels 633 as illustrated which are adapted to promote heat dissipation. At least one, but generally all the vents 632 and channels 633 are in fluid communication with the interior chamber. In this embodiment, the vents 632 are again rectangles similar to those illustrated in FIG. 6, but aligned along an axis defined by ends 628 and 630. The surface 614 defines at least one sharp or leading edge 634 for each of the vents adapted to create an eddy current along the surface thereof. In the illustrated embodiment, four sharp edges 634 are defined for each of the vents although other embodiments are contemplated.

It should be appreciated the defining four leading edges and aligning the vents as shown enables the vents to interact with air flowing from four generally perpendicular directions but generally moving along an axis defined by the first and second engagement portions 618 and [618] 619.

In the illustrated embodiment of FIG. 7, the vents 632 are arranged in vent columns 636 and vent rows 638. A pair of adjacent columns 636 and a pair of adjacent rows 638 is indicated. In the present example one vent row 638 and 9 vent columns 636 are illustrated.

Figure 8:
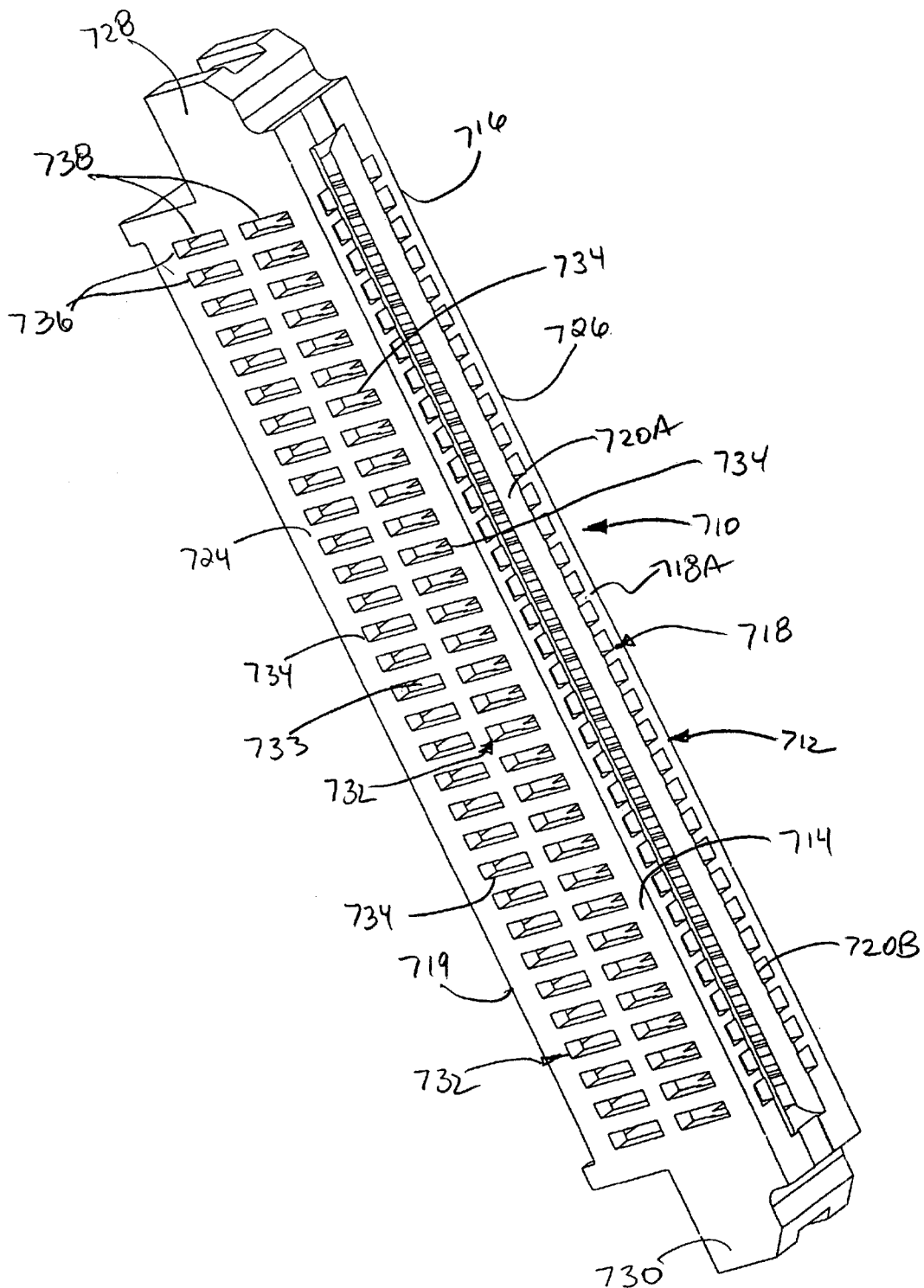
FIG. 8 illustrates a perspective view of a connector having generally rectangular shaped convective vents similar to those of FIGS. 6 and 7 in accordance with one embodiment of the present invention.

Still another embodiment of an electrical connector or connector assembly, generally designated 710, is illustrated in FIG. 8. The illustrated connector 710 comprises a housing 712 having opposing first and second portions or sides 714 and 716 respectively. The subject housing has a first and second engagement portions 718 (having mating surface 718A) and 719 having one or more defined passageways 720 adapted to receive and align a plurality of contacts therein. The two portions 714 and 716 define a cavity or interior chamber (not shown) in fluid communication with the passageways 720 (passageways 720A and 720B are illustrated).

Sides 714 and 716 each have first or outer faces 724 and 726 respectively as illustrated. Two opposing connecting ends 728 and 730 are shown and adapted to engage another connecter, cable, PC board, etc. In one embodiment of the present invention, outer surface 724 and side 714 defines one or more vents 732 as illustrated in FIG. 8 which are adapted to promote conductive cooling in the connecter 710. At least one, but generally all the vents are in fluid communication with the interior chamber. In one embodiment this is accomplished using a channel 733 defined by side 714 and extending between the surface and the interior chamber.

In one embodiment, the vents 732 are rectangular, aligned along the axis defined by the first and second engagement portions 718 and 719. The surface 714 defines at least one sharp or leading edge 734 for each of the vents adapted to create an eddy current along the surface thereof. In the illustrated embodiment, four sharp edges 734 are defined for each of the vents although other embodiments are contemplated.

It should be appreciated the defining four leading edges enables the vents to interact with air flowing from four generally perpendicular directions, but generally moving along an axis defined by the ends 728 and 730.

In the illustrated embodiment of FIG. 8, the vents 732 are arranged in a grid or array that may be defined as vent columns 736 and vent rows 738. A pair of adjacent columns 736 and a pair of adjacent rows 738 is indicated by reference numerals. In the present example there are a total of two vent rows 738 and thirty-one vent columns 736. It should also be appreciated that, while a particular number of vent rows and columns are depicted and discussed, any number of columns and rows are contemplated.

Figure 9:
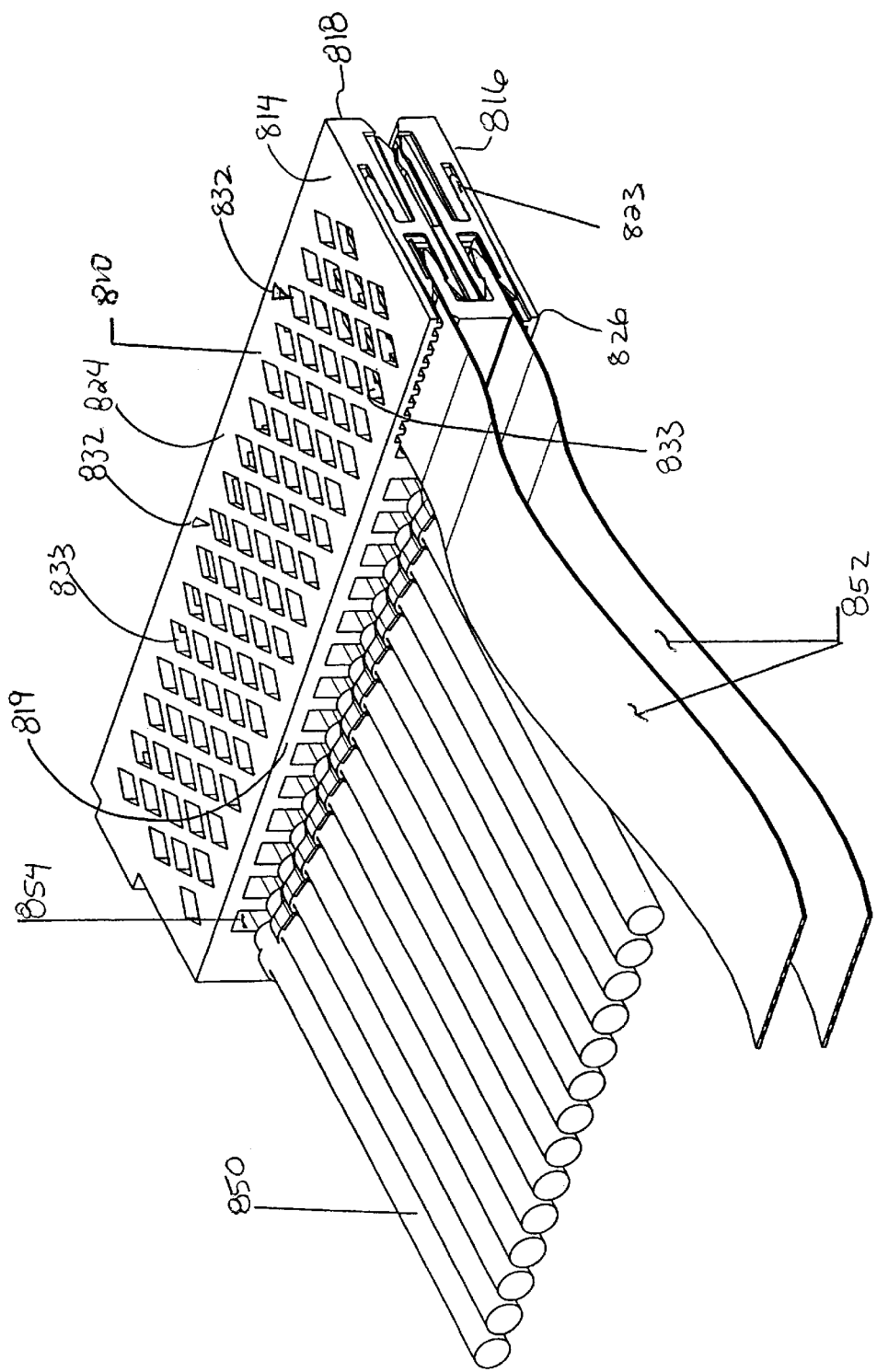
FIG. 9 illustrates a perspective view of a connector having generally diamond shaped convective vents similar to FIG. 2 with conductors connected thereto.

Yet another embodiment of an electrical connector or connector assembly, generally designated 810, is illustrated in FIG. 9. The illustrated connector 810 comprises a housing 812 having opposing first and second portions or sides 814 and 816 respectively. The subject housing has a first and second engagement portions 818 and 819 having one or more defined passageways. The two portions 814 and 816 define a cavity or interior chamber (not shown) in fluid communication with the passageways.

Sides 814 and 816 each have first or outer faces 824 and 826 respectively as illustrated. In one embodiment of the present invention, outer surface 824 and side 814 defines one or more vents 832 as illustrated, which are adapted to promote convective cooling in the connecter 810. At least one, but generally all the vents are in fluid communication with the interior chamber. In one embodiment this communication is accomplished using a channel 833 defined by side 814 and extending between the surface and the interior chamber.

In the illustrated embodiment, the connector 810 includes electrical contact devices 823 contacting round wire conductors 850 or flat ribbon connectors 852. This conductor may be routed through housing 810 via passageways 854 to permit convective cooling in and around the termination areas between the conductors and the resilient electrical contact devices 823. It should be appreciated, as provided previously, that the contemplated termination styles are not limited to those illustrated in FIG. 1 (through-hole soldered to printed circuit board) and FIG. 9 (round wire or ribbon cable). Additional termination techniques, surface mount soldered to printed circuit board for example, and additional connector housing geometries, circular connectors and multiple row (more than two rows for example, are contemplated.

With reference to the embodiments illustrated in FIGS. 1 through 9, each of the housing is preferably configured or formed as a single unit. However, it is contemplated that the housing is formed of two or more pieces joined together to form an integral unit.

In accordance with at least one embodiment of the present invention, a circuit board is provided. The circuit board includes a circuit trace and a connector adapted to engage the circuit trace.

In yet another embodiment, the present invention includes a method of convectively cooling an electrical connector. The method includes creating an eddy current along a surface of the connector and creating a turbulent air flow in an interior chamber of the connector using the eddy current, thereby convectively cooling the electrical connector. In one embodiment of this invention, the method includes creating the eddy current along at least one edge of at least one vent defined in the surface of the connector.

While particular elements, embodiments and applications of the present invention have been shown and described, it will be understood, of course, that the invention is not limited thereto since modifications may be made by those skilled in the art, particularly in light of the foregoing teachings. It is therefore contemplated by the appended claims to cover such modifications as incorporate those features that which come within the spirit and scope of the invention.

What is claimed is:

1. An electrical connector comprising:
    a housing defining an interior chamber and having at least one mating surface defined on a first plane and a surface defined on a second plane;
    at least one passageway defined by said mating surface and adapted to receive at least one contact; and
    at least one vent defined therein by said surface, wherein said at least one vent is angled toward a side surface of said housing and is adapted to create turbulent airflow in said interior chamber.

2. The connector of claim 1, wherein said vent includes a channel in fluid communication with said interior chamber.

3. The connector of claim 1, wherein said vent includes an edge adapted to create an eddy current along said surface.

4. The connector of claim 1, wherein said vent is generally round in shape.

5. The connector of claim 1, wherein said vent is generally oval in shape.

6. The connector of claim 1, wherein said vent is polygonal in shape.

7. The connector of claim 6, wherein said vent is generally diamond shaped.

8. The connector of claim 6, wherein said vent is generally rectangular.

9. The connector of claim 6, wherein said vent is generally square.

10. The connector of claim 1 including a plurality of vents.

11. The connector of claim 10, wherein at least two of said vents are different sizes.

12. The connector of claim 10, wherein at least two of said vents are different shapes.

13. The connector of claim 10, wherein said vents are arranged in rows.

14. The connector of claim 10, wherein said vents are arranged in columns.

15. The connector of claim 10, wherein said vents are arranged randomly.

16. The connector of claim 10, wherein at least two of said vents are angled towards opposing sides of said housing.

17. The connector of claim 1, having a plurality of electrical contacts disposed therein.

18. The connector of claim 1, wherein said mating surface defines at least one passageway adapted to receive at least one electrical contact.

19. The connector of claim 1, wherein said housing is formed of an insulative material.

20. The connector of claim 19, wherein all of said vents are similar shapes.

21. The connector of claim 19, wherein at least two of said vents are different sizes.

22. The connector of claim 1, wherein a circuit board is disposed in said interior portion.

23. The connector of claim 1, wherein said housing has opposing sides defining said interior chamber.

24. The connection of claim 23, wherein only one of said sides defines a plurality of vents.

25. The connector of claim 23, wherein each of said sides defines a plurality of vents.

26. The connector of claim 23, wherein said number of vents are equal on both sides.

27. The connector of claim 23, wherein said number of vents on said opposing sides are different.

28. The connector of claim 23, wherein at least two of said vents are different shapes.

29. The connector of claim 23, wherein all of said vents are the same size.

30. An electrical connector comprising:
   an insulative housing having two opposing sides defining an interior chamber, and two engagement portions perpendicular to the opposing sides;
   at least one passageway defined by said engagement portion; and
   a plurality of vents defined in at least one of said sides, wherein at least one of said vents is angled towards at least one of said opposing sides and is adapted to create a turbulent air flow in said interior chamber.

31. The connector of claim 30, wherein each of said vents define a channel in fluid communication with said interior chamber.

32. The connector of claim 30, wherein at least one of said sides has a surface, said surface defining at least one leading edge for each of said vents adapted to create an eddy current along said surface.

33. The connector of claim 32, wherein at least one of said vents are polygonal in shape.

34. The connector of claim 30, wherein at least two of said vents are different sizes.

35. The connector of claim 30, wherein at least two of said vents are different shapes.

36. The connector of claim 30, wherein said vents are arranged in rows and columns.

37. The connector of claim 30, wherein said vents are randomly arranged.

38. The connector of claim 30, wherein both of said sides defines a plurality of vents.

39. The connector of claim 38, wherein said number of vents are equal on both sides.

40. A circuit board comprising:
   a circuit trace; and
   a connector adapted to engage said circuit trace, wherein said connector includes a housing having opposing sides defining an interior chamber and opposing engagement portions defining passageways perpendicular to said opposing sides, wherein at least one of said sides defines a plurality of vents therein, wherein at least one of said vents is angled towards at least one of said opposing sides and is adapted to create a turbulent air flow in said interior chamber.

41. An electrical connector comprising:
   a housing defining an interior chamber and having at least one mating surface defined on a first plane and a surface defined on a second plane;
   at least one passageway defined by said mating surface and adapted to receive at least one contact; and
   at least two vents defined therein by said surface, wherein said at least two vents having different shapes and are adapted to create turbulent airflow in said interior chamber.

42. An electrical connector comprising:
   a housing defining an interior chamber and having at least one mating surface defined on a first plane and a surface defined on a second plane;
   at least one passageway defined by said mating surface and adapted to receive at least one contact; and
   at least two vents defined therein by said surface, wherein said at least two vents are arranged randomly and adapted to create turbulent airflow in said interior chamber.

43. An electrical connector comprising:
   a housing having opposing sides defining an interior chamber and having at least one mating surface defined on a first plane and a surface defined on a second plane;
   at least one passageway defined by said mating surface and adapted to receive at least one contact; and
   at least two vents defined in only one of said sides and adapted to create turbulent airflow in said interior chamber.

* * * * *